(12) United States Patent
Osawa et al.

(10) Patent No.: US 8,124,992 B2
(45) Date of Patent: Feb. 28, 2012

(54) LIGHT-EMITTING DEVICE, MANUFACTURING METHOD THEREOF, AND LAMP

(75) Inventors: Hiroshi Osawa, Chiba (JP); Naoki Fukunaga, Munakata (JP); Hironao Shinohara, Ichihara (JP)

(73) Assignee: Showa Denko K.K., Tokyo (JP)

( * ) Notice: Subject to any disclaimer, the term of this patent is extended or adjusted under 35 U.S.C. 154(b) by 478 days.

(21) Appl. No.: 12/199,723

(22) Filed: Aug. 27, 2008

(65) Prior Publication Data
US 2010/0052007 A1    Mar. 4, 2010

(51) Int. Cl.
*H01L 33/00* (2010.01)
(52) U.S. Cl. ............. 257/98; 257/E33.064; 257/E33.07; 438/29
(58) Field of Classification Search ............... 257/33.07, 257/98, E33.064, E33.07; 438/29
See application file for complete search history.

(56) References Cited

U.S. PATENT DOCUMENTS

| | | | | |
|---|---|---|---|---|
| 7,439,552 B2 * | 10/2008 | Takigawa et al. | ............... | 257/98 |
| 2005/0236630 A1 * | 10/2005 | Wang | ............... | 257/80 |
| 2005/0258441 A1 * | 11/2005 | Shitagami | ............... | 257/88 |
| 2007/0290222 A1 * | 12/2007 | Huang | ............... | 257/99 |
| 2008/0308833 A1 * | 12/2008 | Moriyama et al. | ..... | 257/E33.064 |

FOREIGN PATENT DOCUMENTS

| JP | 6-291368 A | 10/1994 |
|---|---|---|
| JP | 2000-196152 A | 7/2000 |
| JP | 2005-011737 A | 1/2005 |
| JP | 2007220971 A * | 8/2007 |

OTHER PUBLICATIONS

Yutaka Furubayashi, et al.; "A Transparent Metal: Nb-doped anatase $TiO_2$"; Applied Physics Letters 86, 252101 (2005); Jun. 20, 2005; pp. 252101-252103.

Japanese Office Action dated Apr. 19, 2011 for corresponding Japanese Patent Application No. 2006-041085.

* cited by examiner

*Primary Examiner* — Matthew Landau
*Assistant Examiner* — Sun M Kim
(74) *Attorney, Agent, or Firm* — Sughrue Mion, PLLC (57) ABSTRACT

The present invention provides a light-emitting device comprising an n-type semiconductor layer, a light-emitting layer, a p-type semiconductor layer and a titanium oxide-based conductive film layer laminated in this order, wherein the titanium oxide-based conductive film layer comprises a first layer as a light extraction layer and a second layer as a current diffusion layer, the second layer being arranged on the p-type semiconductor layer side of the first layer, a method of manufacturing a light-emitting device, and a lamp.

23 Claims, 7 Drawing Sheets

FIG. 4A RECTANGULAR SHAPE

FIG. 4B SLOPE SHAPE

FIG. 4C CURVED SHAPE

LIGHT-EMITTING DEVICE, MANUFACTURING METHOD THEREOF, AND LAMP

BACKGROUND OF THE INVENTION

1. Field of the Invention

The present invention relates to a light-emitting device, particularly to a light-emitting device having high reliability and excellent light extraction efficiency, a manufacturing method thereof, and a lamp.

2. Description of Related Art

In recent years, gallium nitride (GaN)-based compound semiconductor materials, which are nitride-based semiconductors, have become of interest as a semiconductor material for producing a light-emitting device that emits light of short wavelength. A GaN-based compound semiconductor is grown on a substrate of sapphire single crystal, a variety of oxides, or a Group III-V compound, through a metal-organic chemical vapor deposition method (MOCVD method), a molecular-beam epitaxy method (MBE method), or the like.

Figure 1:
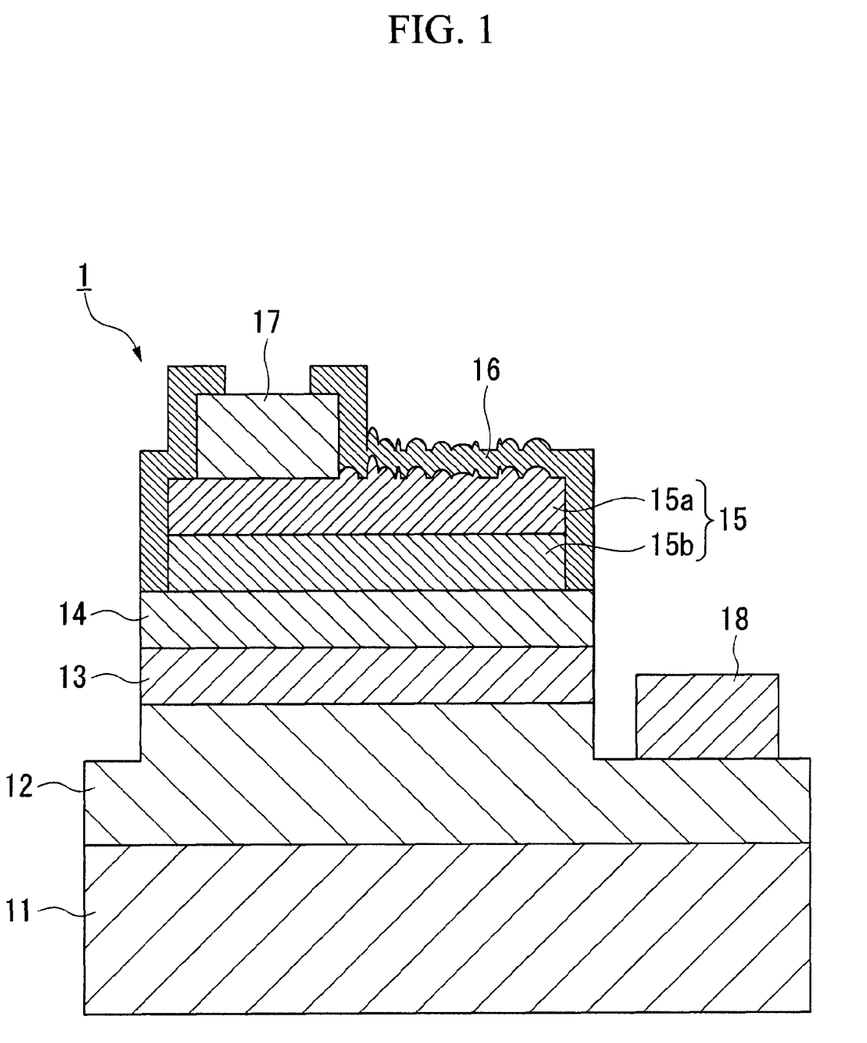
FIG. 1 is a schematic diagram illustrating an example of a light-emitting device of the present invention, showing a cross-sectional structure.

As a structure of a general GaN-based compound semiconductor light-emitting device, if a sapphire single crystal substrate is employed, an n-type semiconductor layer, a light-emitting layer, and a p-type semiconductor layer are laminated in this order. Since the sapphire substrate is an insulator, the device structure generally has a structure as shown in FIG. 1 in which a positive electrode formed on the p-type semiconductor layer and a negative electrode formed on the n-type semiconductor layer are present in the same plane. Such a GaN-based compound semiconductor light-emitting device has two types: a face up type in which a transparent electrode is used as a positive electrode to extract light from the p-type semiconductor side; and a flip chip type in which a high reflective film of Ag or the like is used as a positive electrode to extract light from the sapphire substrate side.

For providing the transparent electrode on the p-type semiconductor, a metal transparent electrode made of Ni/Au or the like has been conventionally used. In recent years, however, in order to improve the light extraction efficiency of light-emitting devices, translucent conductive oxide films of ITO or the like have been practically and positively used at an industrial level.

External quantum efficiency is used as an index to improve the output from such a light-emitting device. It can be said that a higher external quantum efficiency means a light-emitting device with higher output.

The external quantum efficiency is represented as the multiplication of internal quantum efficiency and light extraction efficiency.

The internal quantum efficiency is the proportion of energy converted into light amongst energy of electrical current injected into the device. Meanwhile, the light extraction efficiency is the proportion of light that can be extracted to the outside amongst light generated inside the semiconductor crystal.

There are mainly two ways to improve the light extraction efficiency. The first is a method of reducing absorption of emission wavelength into an electrode, a protective film, or the like formed on the light extraction surface. The other is a method of reducing reflection loss occurring at an interface between materials having different refractive indexes, such as between a compound semiconductor, an electrode, and a protective film.

Here, one of the reasons why a metal transparent electrode of Ni/Au or the like has been replaced by a translucent conductive oxide film of ITO or the like, is that the absorption of the emission wavelength can be reduced by using the translucent conductive oxide film.

As the method of reducing reflection loss occurring at an interface between materials having different refractive indexes, there is a technique in which the light extraction surface is treated to form an uneven surface. As the treatment method of forming the uneven surface, there has been proposed a light-emitting device in which the compound semiconductor itself is treated to form an uneven surface (for example, Patent Document 1).

However, in the light-emitting device described in Patent Document 1, since the semiconductor material is treated, the semiconductor layer is subjected to loading and is thus damaged. Therefore, although the light extraction efficiency is improved, the internal quantum efficiency is lowered, causing a problem in that the emission intensity can not be increased.

In addition, forming concavo-convex on the translucent conductive oxide film can also improve the light extraction efficiency of the light-emitting device. In this case, the translucent conductive oxide film does not only play a role as a current diffusion layer, but also play a role as a light extraction film.

However, since the refractive index of ITO is as small as 1.9, as compared to 2.6 for the GaN-based compound semiconductor, total reflection occurs at the interface between the ITO and the GaN-based compound semiconductor, which causes a problem of insufficient light extraction.

Titanium oxide has, although depending on its wavelength, a refractive index of 2.6 (wavelength 450 nm), which is approximately the same as that of the GaN-based compound semiconductor. Although titanium oxide is an insulator, it has been recently revealed to become conductive by adding Nb or the like (refer to Non-patent Document 1).

By using such conductive titanium oxide for a transparent electrode and by forming an uneven surface on the titanium oxide rather than forming an uneven surface on the GaN-based compound semiconductor, the light extraction efficiency of the light-emitting device can be readily improved.

[Patent Document 1] Japanese Patent No. 2836687

[Non-patent Document 1] American Institute of Physics, "A Transparent metal: Nb-Doped anatase $TiO_2$", Applied Physics Letter 86, 252101 (2005) (US), 20 Jun. 2005, p 252101-252103

SUMMARY OF THE INVENTION

As mentioned above, in the light-emitting device in which a titanium oxide-based conductive film is used for the transparent electrode, the titanium oxide-based conductive film does not only plays a rule as a current diffusion layer, but also plays a rule as a light extraction layer.

However, when forming concavo-convex on the surface of the titanium oxide-based conductive film, since the formation of concavo-convex shape is difficult to control, an excessive etching is performed on the titanium oxide-based conductive film, thereby causing a problem of reducing the current diffusion properties.

The present invention addresses the above mentioned problems with an object of providing a light-emitting device having excellent current diffusion properties and light extraction efficiency, a manufacturing method thereof, and a lamp.

To solve the above problems, the inventors of the present invention have conducted intensive studies. As a result, they have completed the present invention.

That is, the present invention relates to the following.

[1] A light-emitting device comprising an n-type semiconductor layer, a light-emitting layer, a p-type semiconductor layer and a titanium oxide-based conductive film layer laminated in this order, wherein the titanium oxide-based conductive film layer comprises a first layer as a light extraction layer and a second layer as a current diffusion layer, the second layer being arranged on the p-type semiconductor layer side of the first layer.

[2] A light-emitting device comprising an n-type semiconductor layer, a light-emitting layer, a p-type semiconductor layer and a titanium oxide-based conductive film layer laminated in this order, wherein the titanium oxide-based conductive film layer comprises a first layer made of a granular crystal and a second layer made of a columnar crystal, the second layer being arranged on the p-type semiconductor layer side of the first layer.

[3] The light-emitting device according to [1] or [2], wherein the surface of the first layer opposite to the second layer side is in a concavo-convex shape.

[4] The light-emitting device according to [3], wherein the concavo-convex shape formed on the first layer is formed by etching, and the first layer is made of a material in which the etching rate is higher than an etching rate of a material used for the second layer.

[5] The light-emitting device according to [3] or [4], wherein the concavo-convex shape formed on the first layer includes randomly formed concave part and convex part.

[6] The light-emitting device according to [5], wherein the elevation difference between the concave part and the convex part is within the range from 35 nm to 2000 nm.

[7] The light-emitting device according to any one of [1] to [6], wherein the second layer of the titanium oxide-base conductive film layer is of an oxide comprising Ti and at least one element selected from the group consisting of Ta, Nb, V, Mo, W and Sb.

[8] The light-emitting device according to any one of [1] to [7], wherein the thickness of the second layer of the titanium oxide-base conductive film layer is within the range from 35 to 2000 nm.

[9] The light-emitting device according to any one of [1] to [8], wherein the first layer of the titanium oxide-based conductive film layer is of an oxide comprising Ti and at least one element selected from the group consisting of Ta, Nb, V, Mo, W and Sb.

[10] The light-emitting device according to [1] to [9], wherein the thickness of the first layer of the titanium oxide-base conductive film layer is within the range from 35 to 2000 nm.

[11] The light-emitting device according to [1] to [10], wherein the light-emitting device is made of a nitride-based semiconductor light-emitting device.

[12] The light-emitting device according to [11], wherein the nitride-based semiconductor light-emitting device is a GaN-based semiconductor light-emitting device.

[13] A method of manufacturing a light-emitting device, comprising a first step of forming a second layer as a current diffusion layer on a p-type semiconductor layer, and a second step of forming a first layer as a light extraction layer on the second layer, wherein the light-emitting device comprises an n-type semiconductor layer, a light-emitting layer, the p-type semiconductor layer and a titanium oxide-based conductive film layer laminated in this order, and the titanium oxide-based conductive film layer comprises the first layer and the second layer arranged on the p-type semiconductor layer side of the first layer.

[14] A method of manufacturing a light-emitting device, comprising forming a first layer by a vacuum vapor deposition method, and forming a second layer by a sputtering method, wherein the light-emitting layer includes an n-type semiconductor layer, a light-emitting layer, a p-type semiconductor layer and a titanium oxide-based conductive film layer laminated in this order, and the titanium oxide-base conductive film layer includes the first layer and the second layer arranged on the p-type semiconductor layer side of the first layer.

[15] The method of manufacturing a light-emitting device according to [13], wherein in the first step, the second layer is formed by a sputtering method, and in the second step, the first layer is formed by a vacuum vapor deposition method.

[16] The method of manufacturing a light-emitting device according to [13], wherein in the first step, the second layer is formed at an atmospheric temperature of 300 to 800° C. by a vacuum vapor deposition method.

[17] The method of manufacturing a light-emitting device according to [16], wherein in the first step, a heat treatment is performed at a temperature of 300 to 800° C. after forming the second layer by a vacuum vapor method.

[18] The method of manufacturing a light-emitting device according to any one of [13] to [17], further comprising a concavo-convex forming step of forming a concavo-convex shape on the surface of the first layer opposite to the second layer side.

[19] The method of manufacturing a light-emitting device according to [18], wherein in the concavo-convex forming step, the concavo-convex shape is formed by a wet etching method.

[20] The method of manufacturing a light-emitting device according to [19], wherein in the concavo-convex forming step, wet etching is performed using at least one selected from the group consisting of hydrofluoric acid, phosphoric acid, sulfuric acid, hydrochloric acid, hydrofluoric acid/nitric acid mixture, hydrofluoric acid/hydrogen peroxide mixture, hydrofluoric acid/ammonium fluoride mixture and hydrofluosilicid acid as an etching solution.

[21] A lamp comprising the light-emitting device according to any one of [1] to [12].

[22] A lamp comprising a light-emitting device obtained by the method of manufacturing a light-emitting device according to any one of [13] to [20].

According to the light-emitting device of the present invention, the titanium oxide-based conductive film layer has a configuration in which a first layer as a light extraction layer and a second layer as a current diffusion layer, the second layer being arranged on a p-type semiconductor layer side of the first layer are provided. Therefore, even if a concavo-convex shape is formed on the surface of the first layer opposite to the second layer side, in order to improve the light extraction efficiency, the current diffusion properties of the titanium oxide-base conductive film layer is not reduced.

Therefore, a light-emitting device having excellent current diffusion properties and light extraction efficiency can be obtained.

Further, according to the method of manufacturing a light-emitting device, a light-emitting device having excellent current diffusion properties and light extraction efficiency can be manufactured due to the above-mentioned configuration.

Furthermore, since the light-emitting device of the present invention is used for the lamp of the present invention, the lamp has excellent light-emitting properties.

The reference symbols shown in these figures are defined as follows:

1, 2 . . . Light-emitting device, 5 . . . Lamp, 11, 21 . . . Substrate, 12, 22 . . . N-type semiconductor layer, 13, 23 . . . Light-emitting layer, 14, 24 . . . P-type semiconductor layer, 15, 25 . . . Titanium oxide-based conductive film, 15a, 25a . . . Light extraction layer, 15b, 25b . . . Current diffusion layer, 16, 26 . . . Photocatalytic reaction-prevention layer, 17 . . . Positive electrode, 18 . . . Negative electrode.

BEST MODE FOR CARRING OUT THE INVENTION

Hereunder is a description of one embodiment of a light-emitting device of the present invention and a lamp using the same, with reference to FIGS. 1 to 5.

However, it should be noted that the present invention is not to be limited by any of the following embodiment. For example, components of the embodiment may be appropriately combined.

[Overall Structure of Light-emitting Device]

FIG. 1 is a schematic diagram showing a cross-section of the light-emitting device of the present invention.

In FIG. 1, reference symbol 11 denotes a substrate, 12 denotes an n-type semiconductor layer, 13 denotes a light-emitting layer, 14 denotes a p-type semiconductor layer, 15 denotes a titanium oxide-based conductive film, 16 denoted a photocatalytic reaction-prevention layer, 17 denotes a positive electrode, and 18 denotes a negative electrode.

The light-emitting device 1 of the present embodiment is schematically constituted in such a manner that the titanium oxide-based conductive film 15 is used as a transparent electrode, the titanium oxide-based conductive film layer 15 includes the light extraction layer (first layer) 15a and the current diffusion layer (second layer) 15b, and the photocatalytic reaction-prevention layer 16 is formed so as to cover the titanium oxide-based conductive film 15.

As shown in FIG. 1, the titanium oxide-based conductive film 15 of the present invention is composed of the light extraction layer 15a (the first layer) of an upper layer and the current diffusion layer 15b (the second layer) of a lower layer which is arranged on the p-type semiconductor layer 14 side of the light extraction layer 15a. The titanium oxide-based conductive film 15 may be formed right on the p-type semiconductor layer 14, or above the p-type semiconductor layer 14 via a metal layer (not shown) arranged on the p-type semiconductor layer 14.

Further, the photocatalytic reaction-prevention layer 16 may be formed right on the titanium oxide-based conductive film 15, or above the titanium oxide-based conductive film 15 via a transparent film (not shown) so as to cover the titanium oxide-based conductive film 15.

Hereunder is a detailed description of the light-emitting device 1 of the present embodiment.

(Substrate)

The substrate 11 may be formed of a known substrate material, such as: oxide single crystals including sapphire single crystal ($Al_2O_3$; A-plane, C-plane, M-plane, or R-plane), spinel single crystal ($MgAl_2O_4$), ZnO single crystal, $LiAlO_2$ single crystal, $LiGaO_2$ single crystal, and MgO single crystal; Si single crystal; SiC single crystal; GaAs single crystal; AlN single crystal; GaN single crystal; and boride single crystals such as $ZrB_2$ single crystal.

In the present invention, any substrate material including these known substrate materials may be employed without limitation. Among these, sapphire single crystal and SiC single crystal are particularly preferred.

There is no particular limitation for the planar orientation of the substrate. Moreover, the substrate may be an on-axis substrate or an off-angled substrate.

(Nitride-based Compound Semiconductor)

On the abovementioned substrate 11 are normally laminated the n-type semiconductor layer 12 composed of a nitride-based compound semiconductor, the light-emitting layer 13, and the p-type semiconductor layer 14, through buffer layers (not shown). Moreover, the buffer layer may be unnecessary depending on the substrate to be used and the growth condition of the epitaxial layer.

For the nitride-based compound semiconductor, a variety of nitride-based compound semiconductors such as those represented by the general formula $Al_XGa_YIn_ZN_{1-A}M_A$ ($0 \leq X \leq 1$, $0 \leq Y \leq 1$, $0 \leq Z \leq 1$, and $X+Y+Z=1$. The symbol M represents a Group V element other than nitrogen (N). $0 \leq A < 1$) are known. In the present invention, any gallium nitride-based compound semiconductor represented by the general formula $Al_XGa_YIn_ZN_{1-A}M_A$ ($0 \leq X \leq 1$, $0 \leq Y \leq 1$, $0 \leq Z \leq 1$, and $X+Y+Z=1$. The symbol M represents a Group V element other than nitrogen (N). $0 \leq A < 1$), including these known nitride-based compound semiconductors, may be employed without limitation.

The nitride-based compound semiconductor may contain another Group III element other than Al, Ga, and In, and may also contain, if necessary, an element such as Ge, Si, Mg, Ca, Zn, Be, P, As, and B. Furthermore, in some cases, such nitride-based compound semiconductor contains not only intentionally added elements, but also impurities inevitably contained depending on the film formation conditions, and the like, and trace amounts of impurities contained in raw materials and reaction tube materials.

There is no particular limitation on the method of growing the nitride-based compound semiconductor, and any method known to grow nitride semiconductor may be applied. Examples thereof include MOCVD (metal organic chemical vapor deposition), HVPE (hydride vapor phase epitaxy), and MBE (molecular beam epitaxy). MOCVD is preferably employed from the viewpoints of film thickness controllability and mass productivity.

In the case of the MOCVD method, hydrogen ($H_2$) or nitrogen ($N_2$) is employed as a carrier gas, trimethylgallium (TMG) or triethylgallium (TEG) is employed as a Ga (Group III element) source, trimethylaluminum (TMA) or triethylaluminum (TEA) is employed as an Al (Group III element) source, trimethylindium (TMI) or triethylindium (TEI) is employed as an In (Group III element) source, and ammonia ($NH_3$), hydrazine ($N_2H_4$), or the like is employed as an N (Group V element) source. In addition, for the n-type dopant, monosilane ($SiH_4$) or disilane ($Si_2H_6$) may be employed as an Si source, and an organic germanium compound such as germane gas ($GeH_4$), tetramethylgermanium (($CH_3$)$_4$Ge), or tetraethylgermanium (($C_2H_5$)$_4$Ge) may be employed as a Ge source.

In the case of the MBE method, elemental germanium may also be employed as a source of dopant. For example, for the p-type dopant, bis(cyclopentadienyl)magnesium ($Cp_2Mg$) or bis(ethylcyclopentadienyl)magnesium ($EtCp_2Mg$) is employed as an Mg source.

The n-type semiconductor layer 12 is normally composed of an under layer, an n-contact layer, and an n-clad layer. The n-contact layer may also function as the under layer and/or the n-clad layer.

The under layer is preferably composed of an $Al_xGa_{1-x}N$ layer ($0 \leq x \leq 1$, preferably $0 \leq x \leq 0.5$, and more preferably $0 \leq x \leq 0.1$). The thickness of the under layer is preferably 0.1 μm or more, more preferably 0.5 μm or more, and most preferably 1 μm or more. By having the film thickness of 1 μm or more, the $Al_xGa_{1-x}N$ layer can be readily obtained with excellent crystallinity.

The under layer may be doped with an n-type impurity within a range of $1 \times 10^{17}$ to $1 \times 10^{19}/cm^3$, although it is preferably undoped ($<1 \times 10^{17}/cm^3$) in terms of maintenance of excellent crystallinity. The type of the n-type impurity is not particularly limited. Examples thereof include Si, Ge, and Sn, and preferably Si and Ge.

The temperature for growing the under layer is preferably 800° C. to 1200° C., and it is more preferably adjusted within a range of 1000° C. to 1200° C. If grown within such a temperature range, the under layer can be readily obtained with excellent crystallinity. Moreover, the inner pressure of the MOCVD growth furnace is preferably adjusted to 15 to 40 kPa.

The n-contact layer is preferably composed of an $Al_xGa_{1-x}N$ layer ($0 \leq x \leq 1$, preferably $0 \leq x \leq 0.5$, and more preferably $0 \leq x \leq 0.1$), similar to the under layer. Moreover, the n-contact layer is preferably doped with an n-type impurity, and contains the n-type impurity at a concentration of $1 \times 10^{17}$ to $1 \times 10^{19}/cm^3$, and preferably $1 \times 10^{18}$ to $1 \times 10^{19}/cm^3$, in terms of maintenance of excellent ohmic contact with the negative electrode, prevention of cracking, and maintenance of excellent crystallinity. The type of the n-type impurity is not particularly limited. Examples thereof include Si, Ge, and Sn, and preferably Si and Ge. The growth temperature is similar to the case of the under layer.

The nitride-based compound semiconductor constituting the n-contact layer preferably has the same composition as that of the under layer. The total film thickness of these layers is preferably set within a range of 1 to 20 μm, preferably 2 to 15 μm, and more preferably 3 to 12 μm. If the total film thickness of the n-contact layer and the under layer is within such a range, the crystallinity of the semiconductor can be kept excellent.

The n-clad layer is preferably provided between the n-contact layer and the light-emitting layer 13. By providing the n-clad layer, a non flat portion occurring in the outer most surface of the n-contact layer can be filled. The n-clad layer can be formed of AlGaN, GaN, GaInN, or the like. Moreover, the n-clad layer may also take a superlattice structure having a heterojunction, or multiple laminations of these structures. In the case of GaInN, it is needless to say that the band gap is desirably greater than that of the GaInN of the light-emitting layer.

The thickness of the n-clad layer is not particularly limited, although it is preferably within a range of 0.005 to 0.5 μm, and more preferably 0.005 to 0.1 μm.

Moreover, the concentration of the n-type dopant in the n-clad layer is preferably within a range of $1 \times 10^{17}$ to $1 \times 10^{20}/cm^3$, and more preferably $1 \times 10^{18}$ to $1 \times 10^{19}/cm^3$. The dopant concentration is preferably within this range in terms of maintenance of excellent crystallinity and reduction of the operating voltage for the light-emitting device.

For the light-emitting layer 13 laminated on the n-type semiconductor layer 12, there is normally employed a light-emitting layer composed of a nitride-based compound semiconductor, and preferably a nitride-based compound semiconductor made of $Ga_{1-s}In_sN$ ($0 < s < 0.4$).

The thickness of the light-emitting layer 13 is not particularly limited, although it is preferably a film thickness to a degree capable of providing a quantum effect, namely a critical film thickness. For example, the thickness is within a range of 1 to 10 nm, and more preferably 2 to 6 nm. The film thickness is preferably within the above range in terms of light emission output.

Moreover, the light-emitting layer may take not only a single quantum well (SQW) structure as mentioned above, but also a multiple quantum well (MQW) structure comprising the above $Ga_{1-s}In_sN$ as a well layer, and an $Al_cGa_{1-c}N$ ($0 \leq c < 0.3$ and $b > c$) barrier layer having a greater band gap energy than that of the well layer. Moreover, the well layer and the barrier layer may be doped with an impurity.

The temperature for growing the $Al_cGa_{1-c}N$ barrier layer is preferably 700° C. or more. It is more preferable to grow the barrier layer at 800° C. to 1100° C. since excellent crystallinity can be achieved. Moreover, the GaInN well layer is grown at 600° C. to 900° C., and preferably 700° C. to 900° C. That is, the growth temperature is preferably varied between layers so as to achieve excellent crystallinity of the MQW.

The p-type semiconductor layer 14 is normally composed of a p-clad layer and a p-contact layer. However, the p-contact layer may also function as the p-clad layer.

The p-clad layer is not particularly limited as long as the composition allows a greater band gap energy than that of the light-emitting layer and carrier confinement in the light-emitting layer 13 can be achieved, although $Al_dGa_{1-d}N$ ($0 < d \leq 0.4$, and preferably $0.1 \leq d \leq 0.3$) is preferred. The p-clad layer is preferably composed of such AlGaN in terms of carrier confinement in the light-emitting layer 13.

The thickness of the p-clad layer is not particularly limited, although it is preferably 1 to 400 nm and more preferably 5 to 100 nm.

The concentration of the p-type dopant in the p-clad layer is preferably $1 \times 10^{18}$ to $1 \times 10^{21}/cm^3$, and more preferably $1 \times 10^{19}$ to $1 \times 10^{20}/cm^3$. When the p-type dopant concentration is within the above range, excellent p-type crystals can be obtained without impairing the crystallinity.

The p-contact layer is a nitride-based compound semiconductor layer comprising at least $Al_eGa_{1-e}N$ ($0 \leq e < 0.5$, preferably $0 \leq e \leq 0.2$, and more preferably $0 \leq e \leq 0.1$). The Al composition is preferably within the above range in terms of maintenance of excellent crystallinity and excellent ohmic contact with the p-ohmic electrode.

The p-type dopant is preferably contained at a concentration of $1 \times 10^{18}$ to $1 \times 10^{21}/cm^3$, and more preferably $5 \times 10^{19}$ to $5 \times 10^{20}/cm^3$, in terms of maintenance of excellent ohmic contact, prevention of cracking, and maintenance of excellent crystallinity.

The type of the p-type impurity is not particularly limited, although a preferred example is Mg.

The thickness of the p-contact layer is not particularly limited, although it is preferably 0.01 to 0.5 μm and more preferably 0.05 to 0.2 μm. The film thickness is preferably within this range in terms of light emission output.

A GaN-based semiconductor is generally used for the light-emitting device, although it is also possible to use a semiconductor light-emitting device made of ZnO, $Ga_2O_3$, or the like rather than such a GaN-based semiconductor.

(Titanium Oxide-based Conductive Film)

As the example (refer to reference symbol 15) shown in FIG. 1, the titanium oxide-based conductive film of the present invention is composed of the light extraction layer 15a of an upper layer and the current diffusion layer 15b of a lower layer which is arranged on the p-type semiconductor layer 14 side of the light extraction layer 15a. The titanium oxide-based conductive film 15 may be formed right on the p-type semiconductor layer 14, or above the p-type semiconductor layer 14 via a metal layer (not shown) arranged on the p-type semiconductor layer 14.

For the titanium oxide-based conductive film, an oxide comprising Ti and at least one element selected from the group consisting of Ta, Nb, V, Mo, W, and Sb may be used.

In this case, for the composition of the titanium oxide-based conductive film, $Ti_{1-x}A_xO_2$ (A=Ta, Nb, V, Mo, W, or Sb) is preferably used. Moreover, in this composition, X is preferably within a range of 1 to 20 at %. If X is less than 1 at %, the effect of addition is small and excellent conductivity can not be achieved. Moreover, if X exceeds 20 at %, the transmittance at the wavelength of 300 to 550 nm decreases and hence the output of the light-emitting device is reduced.

More preferably, X is within a range of 2 to 10 at %.

If $Ti_{1-x}A_xO_2$ is used for the titanium oxide-based conductive film, the conductivity is also changed by the oxygen composition. An oxygen deficient state is preferable since the conductivity is improved. The oxygen deficient state can be made by employing various methods such as: a method in which the oxygen amount is adjusted by reactive evaporation or reactive sputtering with oxygen using a metal; a method in which a metal oxide tablet or target in an oxygen deficient state is used; and a method in which annealing is carried out in a reducing atmosphere of $N_2$ or $H_2$ or the like after the formation of the titanium oxide-based conductive film.

When forming the titanium oxide-based conductive film of the present invention, for example, a manufacturing method including a step (1) of forming the current diffusion layer 15b (the second layer) on the p-type semiconductor layer 14, and a step (2) forming the light extraction layer 15a (the first layer) on the current diffusion layer 15b after the step (1).

Further, for the formation of the titanium oxide-based conductive film, any method such as a vapor deposition method, a sputtering method, a PLD method, and a CVD method may be employed.

When the vapor deposition method is employed, the film can be formed using a tablet of $Ti_{1-x}A_xO_2$ (A=Ta, Nb, V, Mo, W, or Sb) by any method such as resistance heating and EB heating.

Moreover, it is also possible to form the film from respective single metal oxides in separate vapor-deposition sources. Use of this method gives an advantage of facilitating composition control. For example, an arbitrary $Ti_{1-x}Ta_xO_2$ composition can be made by forming the film respectively from $TiO_2$ and $Ta_2O_5$ in separate vapor-deposition sources.

Furthermore, reactive film formation is also possible by using single or alloy metals under introduction of an oxygen gas with plasma, or the like. For example, a $Ti_{1-x}Ta_xO_2$ composition can be made by evaporating Ti and Ta in separate vapor-deposition sources, followed by a reaction of Ti and Ta with an oxygen gas in plasma. Moreover, in order to improve the adhesiveness and the denseness, the substrate may be heated, or ion assist may be also applied.

When the sputtering method is employed, the film can be formed using a tablet of $Ti_{1-x}A_xO_2$ (A=Ta, Nb, V, Mo, W, or Sb) by any method such as RF and DC.

Moreover, it is also possible to form the film from respective single metal oxides in separate targets. Use of this method gives an advantage of facilitating composition control. For example, an arbitrary $Ti_{1-x}Ta_xO_2$ composition can be made by forming $TiO_2$ and $Ta_2O_5$ respectively in separate targets.

Furthermore, reactive sputtering film formation is also possible by using single or alloy metals under introduction of an oxygen gas. For example, a $Ti_{1-x}Ta_xO_2$ composition can be made by electrically discharging Ti and Ta in separate targets, followed by a reaction of Ti and Ta with an oxygen gas in plasma. Moreover, in order to improve the adhesiveness and the denseness, the substrate may be heated, or biasing may also be applied.

The crystal structure of the titanium oxide-based conductive film is not particularly limited, although an anatase type is preferred since the conductivity is excellent.

However, since the anatase type is the crystal structure having the highest photocatalytic reactivities, the photocatalytic reaction-prevention layer needs to be a more dense film.

Further, when the GaN-based semiconductor is used as a light-emitting device, it is preferable in that the refractive indexes of the GaN-based semiconductor and the titanium oxide-based conductive film are the same, or the refractive index difference between the GaN-based semiconductor and the titanium oxide-based conductive film is lower than 0.5 in terms of improvement of the light extraction efficiency.

(Current Diffusion Layer)

Figure 6:
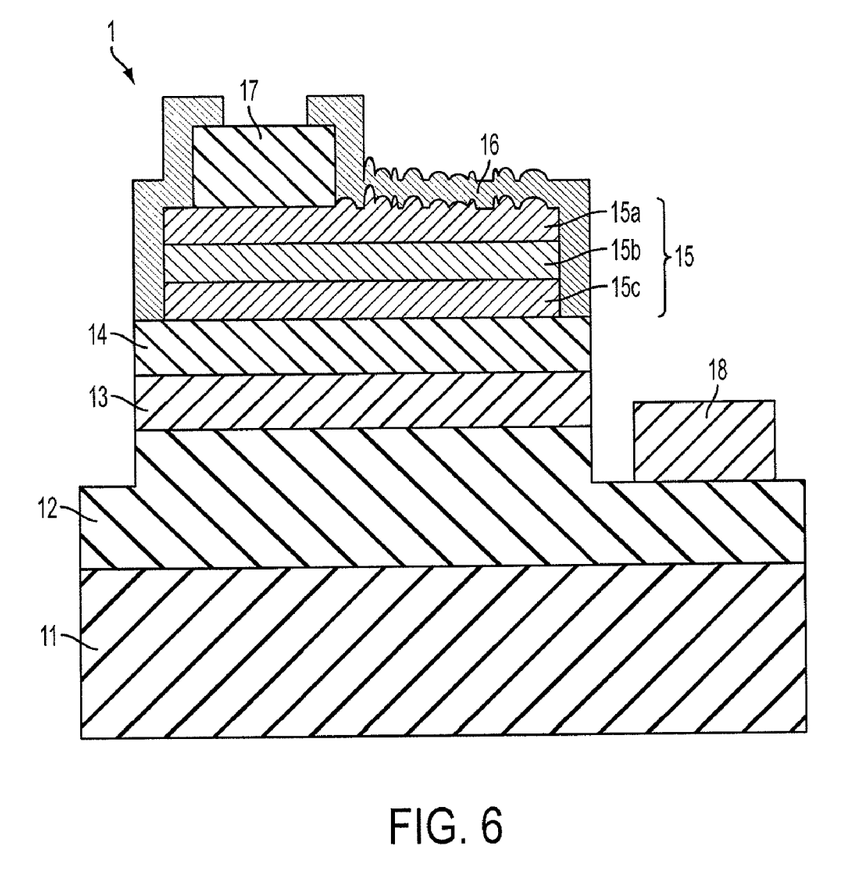
FIG. 6 is a schematic diagram illustrating another embodiment of the light-emitting device of the present invention, showing a cross-sectional structure including metal layer 15c provided between current diffusion layer (a second layer) 15b and p-type semiconductor layer 14.

The current diffusion layer 15b is composed of a titanium oxide-based conductive film having a current diffusion function, and may be formed right on the p-type semiconductor layer 14, or above the p-type semiconductor layer via a metal layer (not shown) or the like. When a metal layer 15c is provided between the current diffusion layer 15b and the p-type semiconductor layer 14, the drive voltage (Vf) of the light-emitting device can be reduced, although the transmittance decreases and the output is reduced. Accordingly, it is appropriately judged whether or not the metal layer or the like should be provided between the current diffusion layer and the p-type semiconductor layer, while taking a balance between the drive voltage (Vf) and the output according to the intended use of the light-emitting device, or the like. When a metal layer is provided between the current diffusion layer and the p-type semiconductor layer, the metal layer to be used is preferably made of Ni, Ni oxide, Pt, Pd, Ru, Rh, Re, Os, or the like.

The current diffusion layer may be formed by any method as long as the current diffusion function can be achieved.

Moreover, the current diffusion layer is preferably formed by the following two methods, for example. The first is a film formation method by sputtering method. The other is a film formation method by vacuum vapor deposition method.

The sputtering method can provide a dense film with excellent crystallinity since the energy of the sputtered particles at the time of sputtering is large. As the crystallinity of the titanium oxide-based conductive film becomes higher, the current diffusion layer becomes more difficult to etch and becomes more difficult to erode at the time of etching, and hence the current diffusion property becomes more difficult to deteriorate by etching.

In the vacuum vapor deposition method, the obtained film composed of the titanium oxide-based conductive film is in an amorphous state, or with low crystallinity, since the energy of particles at the time of evaporation is not so large.

However, a dense film with excellent crystallinity can be obtained by forming a film at a temperature of 300° C. to 800° C. during evaporation, or applying a heat treatment at 300° C. to 800° C. after the film formation.

If the heat treatment temperature is less than 300° C., the effect of improving crystallization is small. If the temperature exceeds 800° C., the nitride-based semiconductor device is damaged.

The titanium oxide-based conductive film constituting the current diffusion layer may take any crystalline state, although a columnar crystal is preferred since it is hard to etch.

If the thickness of the current diffusion layer is too thin, the current diffusion property is lowered and thus it is not preferable. Moreover, if the thickness of the current diffusion layer is too thick, the transmittance is worsened and the output is reduced. Accordingly, the thickness of the current diffusion layer is within a range of 35 nm to 2000 nm, more preferably 50 nm to 1000 nm, and most preferably 100 nm to 500 nm.

Figure 7:
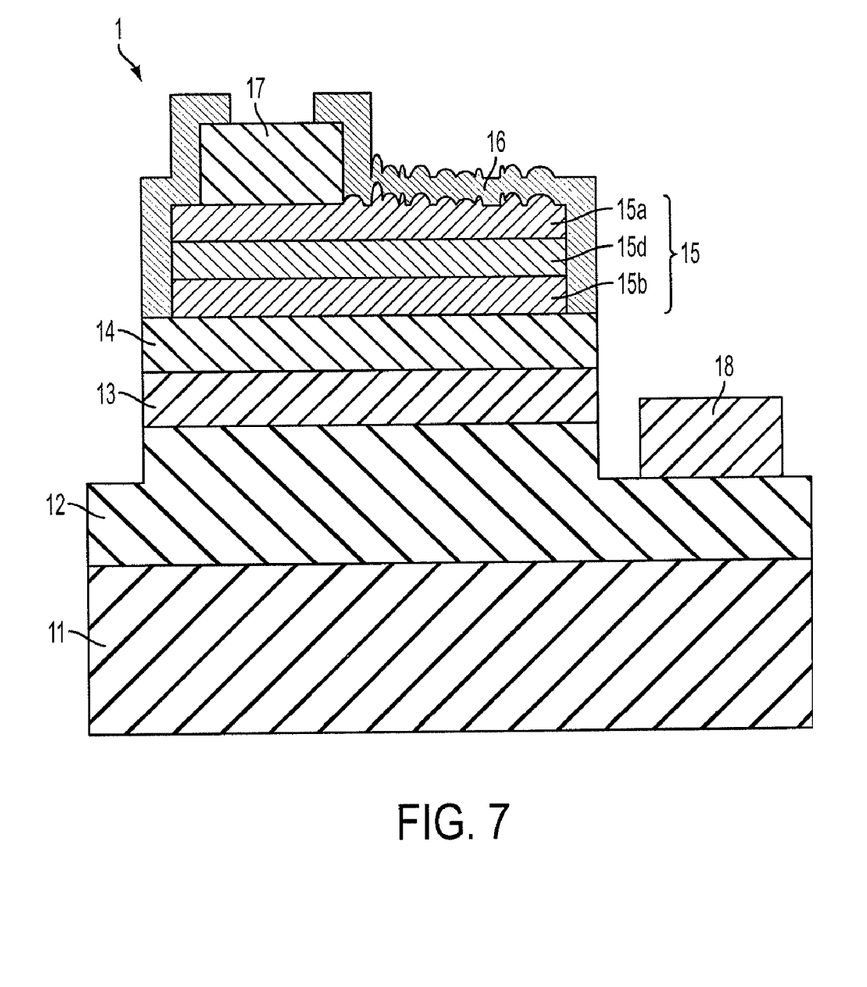
FIG. 7 is a schematic diagram illustrating yet another embodiment of the light-emitting device of the present invention, showing a cross-sectional structure including metal layer 15d provided between light extraction layer (a first layer) 15a and current diffusion layer (a second layer) 15b.

The light extraction layer 15a is composed of a titanium oxide-based conductive film having a light extraction function, and is formed on the current diffusion layer 15b. The structure may be either such that the light extraction layer 15a is formed right on the current diffusion layer 15b, or such that a metal layer 15d or the like is arranged between the light extraction layer 15a and the current diffusion layer 15b.

In order to reduce the drive voltage (Vf) of the light-emitting device, a metal layer or the like may be formed between the light extraction layer 15a and the current diffusion layer 15b as mentioned above. However, since there is a risk of reducing the transmittance of the light-emitting device and reducing the output, it is necessary to determine a balance according to the intended use. When a metal layer 15d is provided between the light extraction layer 15a and the current diffusion layer 15b, the metal layer to be used is preferably made of Ni, Ni oxide, Pt, Pd, Ru, Rh, Re, Os, or the like.

The top surface of the light extraction layer is preferably in a concavo-convex shape so as to improve the light extraction efficiency.

As the method of forming the concavo-convex shape, any already known etching method such as wet etching and dry etching may be applied, although wet etching is preferably employed since the etching speed is greatly changed depending on the crystalline state of the titanium oxide-based conductive film. A regular concavo-convex shape may be formed using a mask, while a random concavo-convex shape may also be formed by etching alone.

When wet etching is performed, hydrofluoric acid, phosphoric acid, sulfuric acid, hydrochloric acid, hydrofluoric acid/nitric acid mixture, hydrofluoric acid/hydrogen peroxide mixture, hydrofluoric acid/ammonium fluoride mixture, hydrofluosilicic acid, or the like may be employed as an etching liquid, although hydrofluoric acid, hydrofluoric acid/nitric acid mixture, hydrofluoric acid/hydrogen peroxide mixture, hydrofluoric acid/ammonium fluoride mixture, and hydrofluosilicic acid ($H_2SiF_6$) are more preferably employed.

The light extraction layer of the present invention is preferably composed of a material having a higher etching speed than that of the material used for the aforementioned current diffusion layer. Moreover, the light extraction layer may take any crystalline state, although granular crystal is preferred since it is easy to etch.

Furthermore, as the method of forming the light extraction layer, it is desirable to employ a method in which the formation can be performed at a higher etching speed for etching the light extraction layer than the etching speed for the current diffusion layer. Specifically, as the method of forming the light extraction layer, for example, a vacuum vapor deposition method is preferably employed since the film in an amorphous state, or with low crystallinity, can be obtained.

If the thickness of the light extraction layer 15a is too thin, the elevation difference between the convex part and the concave part constituting the concavo-convex shape formed on the top surface of the light extraction layer becomes too small to provide a sufficient light extraction efficiency. Moreover, if the thickness of the light extraction layer is too thick, the transmittance is worsened and the output is reduced.

The thickness of the etched light extraction layer which satisfies this property is within a range of 35 nm to 2000 nm, preferably 50 nm to 1 µm, and more preferably 100 nm to 500 nm. The thickness of the light extraction layer is defined as the height from the surface (bottom face) of the light extraction layer on the current diffusion layer side to the apex of the convex part.

The elevation difference between the convex part and the concave part constituting the concavo-convex shape on the light extraction layer 15a is preferably within a range of 35 nm to 2000 nm, more preferably 50 nm to 1 µm, and most preferably 100 nm to 500 nm.

If the elevation difference between the convex part and the concave part is too small, a sufficient light extraction efficiency can not be obtained. Moreover, if the elevation difference between the convex part and the concave part is too large, the thickness of the light extraction layer becomes so thick that the transmittance is worsened and the output is reduced. The elevation difference between the convex part and the concave part is defined as the height from the bottom of the concave part to the apex of convex part.

[Step Coverage]

When a concavo-convex shape is formed on the titanium oxide-based conductive film 15, the step coverage of a film formed thereon becomes a problem. For example, if the slope of the concavo-convex is too steep, if the aspect ratio is too large, or if the size of the concavo-convex is too small, then the film to be formed on the titanium oxide-based conductive film is not formed along the profile of the concavo-convex and generates a gap. If a gap is generated, the refractive index in that area becomes 1, which causes a lowering of the light extraction efficiency.

As the film formation method for improving the step coverage, a CVD method and a sputtering method are suitable. When a film is formed by the sputtering method, it is more preferable to employ a method in which a high frequency power source (13 MHz or more, and more preferably 60 MHz±10 MHz) is used for the sputter source which biases the surface of the formed film.

Figure 4A:
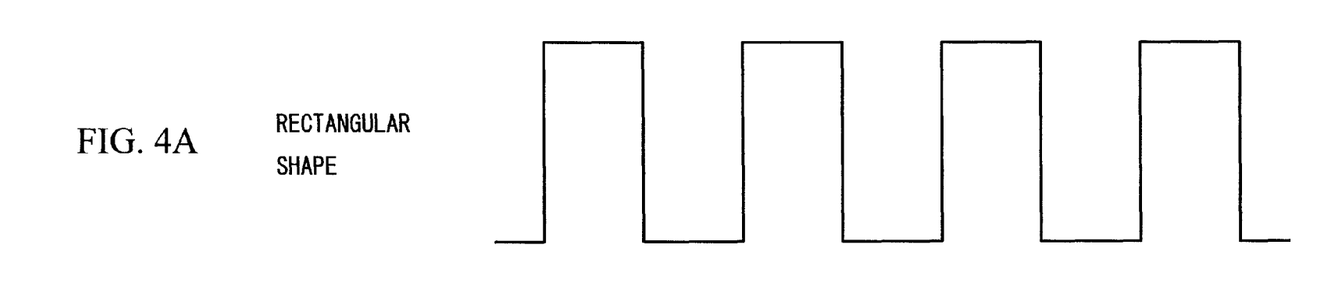
FIG. 4A is a schematic diagram illustrating the light-emitting device of the present invention, showing a fragmentary cross-sectional structures of the light-emitting device shown in FIG. 2, which is rectangular-shaped.

With respect to the shape of the concavo-convex, rectangular convex parts as shown in FIG. 4A are not capable of providing excellent step coverage. In order to obtain excellent step coverage, the bottom end dimension of the convex part is preferably greater than the top end dimension thereof. A shape in which the dimension is gradually tapered from the bottom end to the top end is more preferred.

Figure 4B:
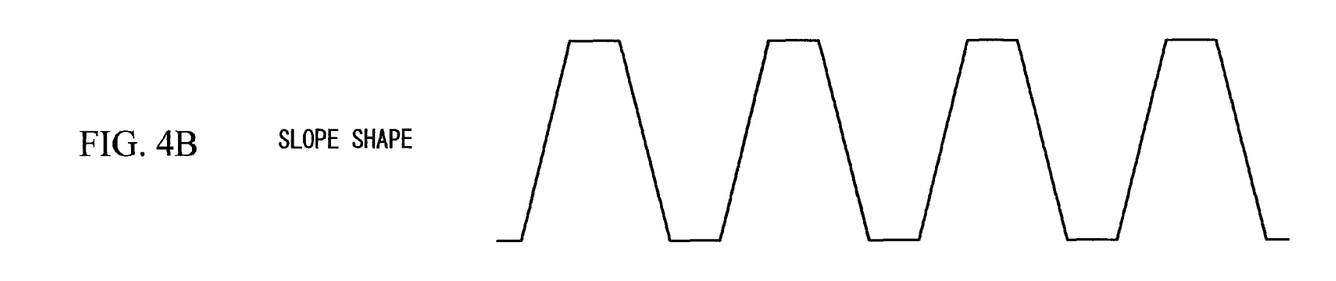
FIG. 4B is a schematic diagram illustrating the light-emitting device of the present invention, showing a fragmentary cross-sectional structures of the light-emitting device shown in FIG. 2, which is slope-shaped.
Figure 4C:
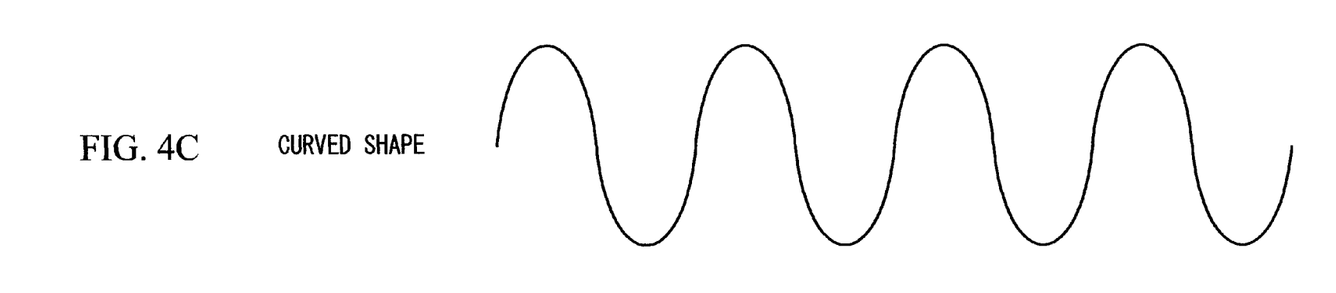
FIG. 4C is a schematic diagram illustrating the light-emitting device of the present invention, showing a fragmentary cross-sectional structures of the light-emitting device shown in FIG. 2, which is curved-shaped.

Specifically preferred examples thereof include slope-shaped convex parts as shown in FIG. 4B and curved-shaped convex parts as shown in FIG. 4C. In the case of the slope-shaped convex parts, the inclination with respect to the normal line of the substrate is preferably 5 degrees or more, since the step coverage is improved. However, if the inclination with respect to the normal line of the substrate is too large, it is difficult to obtain the aspect ratio. Therefore, the angle is preferably set to 60 degrees or less.

(Photocatalytic Reaction-prevention Layer)

The photocatalytic reaction-prevention layer of the present invention may be formed right on the titanium oxide-based conductive film 15, or above the titanium oxide-based conductive film 15 via a transparent film or the like as shown in the example of FIG. 1 (refer to reference symbol 16).

As generally well-known, titanium oxide has a photocatalytic action and has a property to decompose water and organic matters. The photocatalytic action is widely used in industry as one which exerts useful effects such as air purification, water purification, antifouling, and antibacterial. However, in a light-emitting device sealed in an organic substance such as a resin to constitute a lamp, there is a problem in that the sealing resin is decomposed and causes negative effects on the light-emitting device.

In a photocatalyst it is known that the photocatalytic action works with a wavelength of 380 nm or less in undoped titanium oxide, and with a wavelength of up to 500 nm in titanium oxide doped with nitrogen or tungsten.

Moreover, it is known that the quantity of light has to be several tens of $\mu W/cm^2$ or more for exerting the photocatalytic action. Accordingly, when titanium oxide is used in a light-emitting device having an emission wavelength of 300 to 550 nm, the situation becomes extremely easy for the titanium oxide to exert the photocatalytic action. Furthermore, when titanium oxide is used in a GaN-based light-emitting device, the device has to be used under an extremely large quantity of light of $1\ W/cm^2$, as is apparent from the fact that an emission intensity of about 10 mW can be obtained from a device of 300 μm-square.

In the case of a light-emitting device having an emission wavelength of 550 nm, the peak wavelength becomes 550 nm. However, many light-emitting devices have a wavelength distribution of constant width, even a light-emitting device having a peak wavelength of 550 nm often has a wavelength of 500 nm. Moreover, in the case of a light-emitting device having several peak wavelengths, if any of these peak wavelengths is present within a range of 300 to 550 nm, the situation becomes easy for titanium oxide to exert the photocatalytic action, which may cause concern of decomposition of the sealing resin as mentioned above.

In the present invention, the photocatalytic reaction-prevention layer 16 is comprised in order to prevent the photocatalytic action.

The photocatalytic reaction-prevention layer 16 is preferably formed so as to cover the lateral faces of the titanium oxide-based conductive film 15 in order to prevent the photocatalytic action through the lateral faces.

Figure 2:
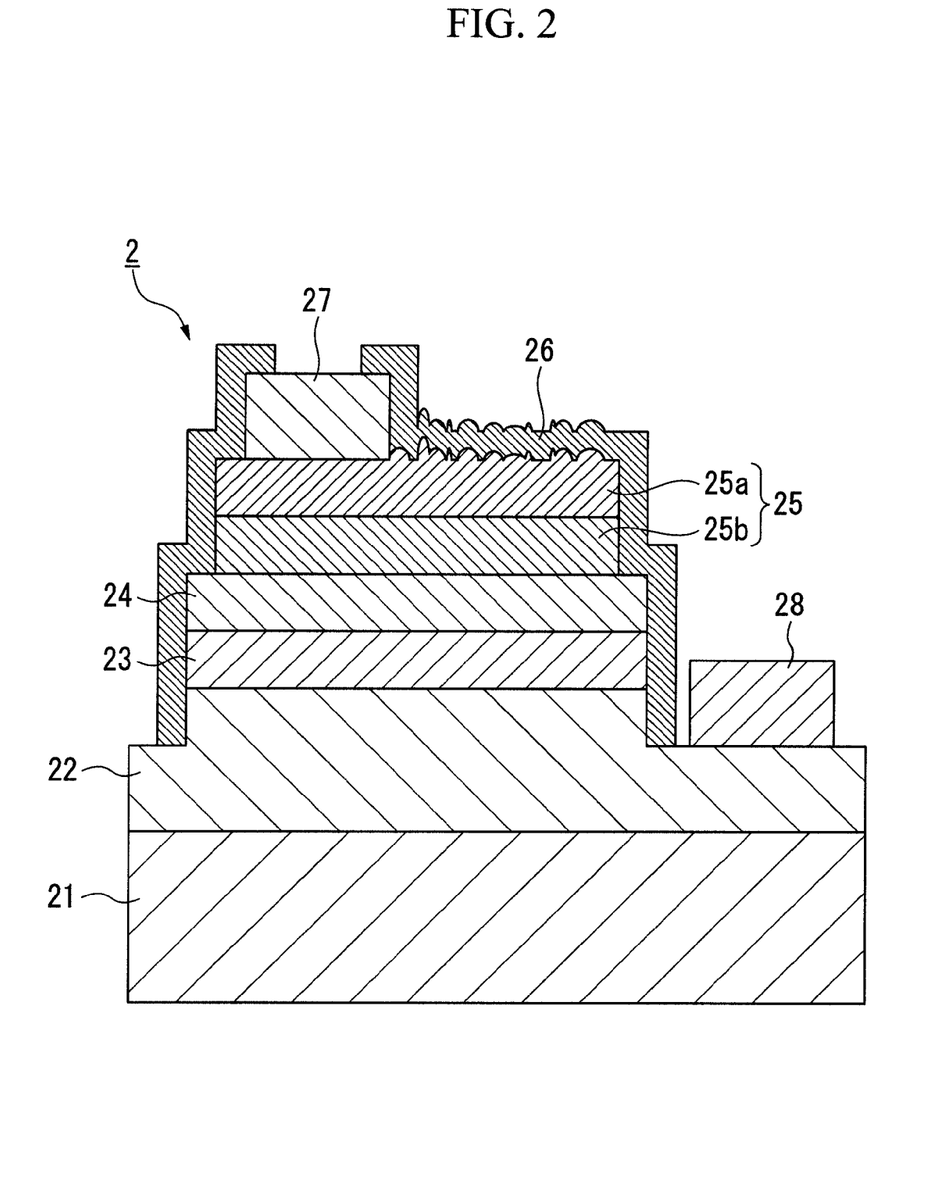
FIG. 2 is a schematic diagram illustrating another example of a light-emitting device of the present invention, showing a cross-sectional structure.

Furthermore, as with the light-emitting device 2 shown in FIG. 2, it is more preferable that the photocatalytic reaction-prevention layer 26 is arranged so as to cover the lateral faces of the n-type semiconductor layer 22, the light-emitting layer 23 and the p-type semiconductor layer 24, and the peripheral area of the top surface of the p-type semiconductor layer 24, since this can prevent the photocatalytic action due to intrusion of moisture or the like from the interface between the photocatalytic reaction-prevention layer 26 and the p-type semiconductor layer 24. Moreover, in order to prevent the photocatalytic action from the joining area between the positive electrode 27 and the titanium oxide-based conductive film 25 into the lateral faces of the positive electrode 27, then as shown in the illustrated example, it is preferable that the photocatalytic reaction-prevention layer 26 is formed so as to cover the peripheral area of the top surface of the positive electrode 27.

The photocatalytic reaction-prevention layer of the present invention has a light transmission property, in addition to the role of preventing the photocatalytic action.

The photocatalytic reaction-prevention layer of the present invention is preferably made of a translucent substance having a transmittance of 80% or more with a wavelength between 300 to 550 nm.

Further, either an insulating transparent film or a conductive transparent film can be used as the photocatalytic reaction-prevention layer.

For the insulating transparent film used as the photocatalytic reaction-prevention layer, any substance may be employed as long as it has an insulation property and a transmittance of 80% or more with a wavelength between 300 to 550 nm. Preferable examples thereof include silicon oxide (such as $SiO_2$), aluminum oxide (such as $Al_2O_3$), hafnium oxide (such as $HfO_2$), niobium oxide (such as $Nb_2O_5$), tantalum oxide (such as $Ta_2O_5$), silicon nitride (such as $Si_3N_4$), and aluminum nitride (such as AlN). It is more preferable to employ $SiO_2$ or $Al_2O_3$, since a dense film can be readily produced through CVD film formation. It is even more preferable to form a film of $Al_2O_3$ through the CVD method since the reliability under high temperature and high humidity is further improved.

When a film of $SiO_2$ is formed through CVD, there may be employed TEOS (tetraethoxysilane), TMS (trimethoxysilane), $SiH_4$, or the like as a raw material.

Moreover, when a film of $Al_2O_3$ is formed through CVD, there may be employed TMA (trimethylaluminum), DMA (dimethylaluminum), alkoxy compounds (isopropoxydimethylaluminum, sec-butoxydimethylaluminum, isopropoxydiethylaluminum, and tert-butoxydimethylaluminum), or the like as a raw material.

For the conductive transparent film used as the phogho-catalytic reaction-prevention layer, any substance may be employed as long as it has conductivity and a transmittance of 80% or more with a wavelength between 300 to 550 nm. Preferable examples thereof include ITO ($In_2O_3$—$SnO_2$), AZO (ZnO—$Al_2O_3$), IZO ($In_2O_3$—ZnO) and GZO (ZnO—$Ga_2O_3$).

Further, when the conductive transparent film is used, since the conduction part between the photocatalytic reaction-prevention layer and the p-type semiconductor is increased by the contact part of the conductive transparent film constituting of the photocatalytic reaction-prevention layer, it is thus advantageous for reducing the drive voltage (Vf).

Since the refractive indexes of the ITO and IZO are 1.9, and the refractive indexes of the AZO and GZO are 2.1, it is thus advantageous for improving the light extraction efficiency as mentioned above. In addition, if the concavo-convex is formed on the surface of the titanium oxide-based conductive film, since the total reflection of the interface between the titanium oxide-based conductive film and the conductive transparent film, the light extraction efficiency improves more.

In addition, if the conductive transparent film is used for the photocatalytic reaction-prevention layer, the light-emitting layer and the n-type semiconductor layer cannot be covered. Thus, an insulating transparent film may be formed on the conductive transparent film so as to cover the light-emitting layer and the n-type semiconductor layer.

Furthermore, the photocatalytic reaction-prevention layer needs to be a dense film. In order to produce the abovementioned silicon oxide film, there is employed a method using a liquid coating material such as SOG (spin-on glass). However, this method is not suitable for the photocatalytic reaction-prevention layer of the present invention, since a dense film is hardly formed and moisture remains in the film even if annealed.

For the formation of the photocatalytic reaction-prevention layer, a film formation method capable of producing dense films, such as sputtering and CVD, may be employed. In particular, CVD is preferably employed since denser films can be produced.

The thickness of the photocatalytic reaction-prevention layer is not particularly limited, although it is preferably within a range of 10 nm to 10 μm (10000 nm). If the thickness of the photocatalytic reaction-prevention layer is less than 10 nm, the layer is too thin to prevent moisture intrusion. Moreover, the upper limit of the thickness of the photocatalytic reaction-prevention layer is not particularly limited, although 10 μm is considered to be the upper limit in terms of productivity.

As mentioned above, another transparent film or the like may be arranged between the titanium oxide-based conductive film 15 and the photocatalytic reaction-prevention layer 16. In particular, it is preferable to put a transparent film having a refractive index ranging between the refractive index of the titanium oxide-based conductive film 15 (refractive index of 2.6) and the refractive index of the phocatalytic reaction-prevention layer 16 from the viewpoints of improving the light extraction efficiency.

For example, when $SiO_2$ (refractive index of 1.5) or $Al_2O_3$ (refractive index of 1.6) is used for the photocatalytic reaction-prevention layer 16, $CeO_2$ (refractive index of 2.2), $HfO_2$ (refractive index of 1.9), MgO (refractive index of 1.7), ITO (refractive index of 1.9), $Nb_2O_5$ (refractive index of 2.3), $Ta_2O_5$ (refractive index of 2.2), $Y_2O_3$ (refractive index of 1.9), ZnO (refractive index of 2.1), $ZrO_2$ (refractive index of 2.1) or the like may be used as the transparent film.

Furthermore, the photocatalytic action of the titanium oxide-based conductive film can be weakened by doping the titanium oxide-based conductive film with iron, aluminum, magnesium, zirconium, or the like. Therefore, the structure may be such that the abovementioned photocatalytic reaction-prevention layer is provided after doping with such an element.

However, the dose of such an element which weakens the photocatalytic action as mentioned above needs to be within a range that would not remarkably spoil the conductivity and transmittance of the titanium oxide-based conductive film.

(Positive Electrode and Negative Electrode)

The positive electrode 17 is a bonding pad provided on the titanium oxide-based conductive film 15. In the example shown in FIG. 1, the lateral faces and peripheral area of the top surface are covered by the photocatalytic reaction-prevention layer 16.

For the material of the positive electrode 17, various structures using Au, Al, Ni, Cu, and the like are well known. These well known materials and structures may be employed without any limitation.

The thickness of the positive electrode 17 is preferably within a range of 100 nm to 10 μm. Moreover, in terms of the property of the bonding pad, the thickness is preferably larger since the bondability becomes higher. Therefore, the thickness of the positive electrode 17 is more preferably 300 nm or more. Furthermore, the thickness is preferably 3 μm or less in terms of the production cost.

As shown in the illustrated example of FIG. 1, the negative electrode 18 is a bonding pad formed to be in contact with the abovementioned n-type semiconductor layer 12 of the gallium nitride-based compound semiconductor in which the n-type semiconductor layer 12, the light-emitting layer 13, and the p-type semiconductor layer 14 are sequentially laminated on the substrate 11.

Therefore, for forming the negative electrode 18, a part of the light-emitting layer 13 and the p-type semiconductor layer 14 is removed to expose the n-contact layer of the n-type semiconductor layer 12, and the negative electrode 18 is formed thereon.

For the material of the negative electrode 19, negative electrodes of various compositions and structures are well known. These well known negative electrodes may be employed without any limitation, and can be provided through a commonly used means which is well known in this technical field.

[Structure of Lamp]

The light-emitting device of the present invention may be constituted as an LED lamp using a method known to those skilled in the art, without any limitation.

Figure 3:
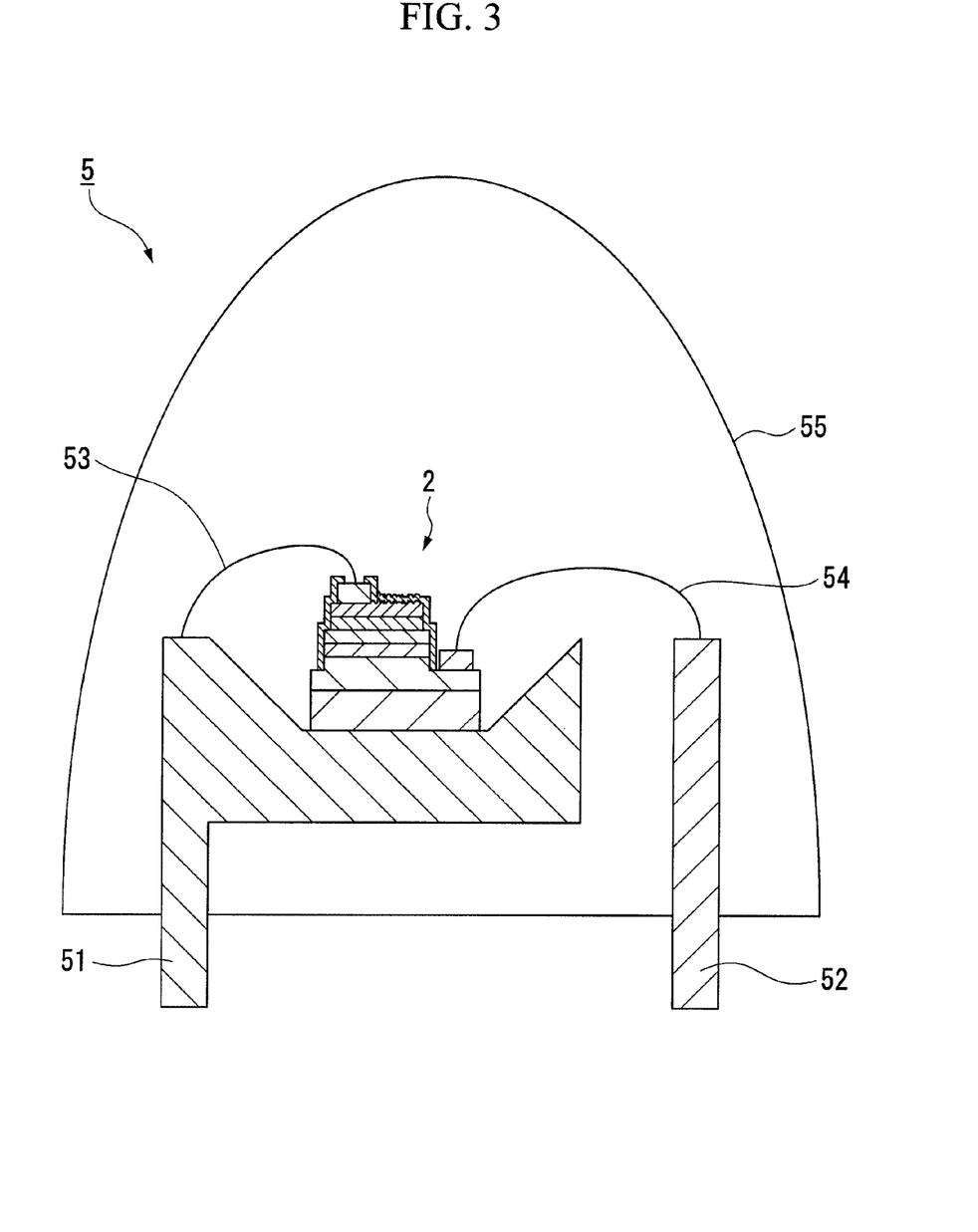
FIG. 3 is a schematic diagram illustrating an example of an example of lamp of the present invention, showing a cross-sectional structure.

FIG. 3 is a cross-sectional view which schematically illustrates an example of a lamp of the present invention. This lamp 5 comprises the light-emitting device 2 composed of the face-up type nitride-based semiconductor of the present invention shown in FIG. 2, mounted in a projectile shape. In FIG. 3, reference symbols 51 and 52 denote frames, reference symbols 53 and 54 denote wires, and reference symbol 55 denotes a mold.

The lamp 5 can be produced using the light-emitting device 2 of the present invention shown in FIG. 2, by an already known method. Specifically, for example, the projectile-shaped lamp shown in FIG. 3 can be produced by the following manner. The light-emitting device 2 is adhered onto either one of the two frames 51 and 52 (frame 51 in FIG. 3) with a resin or the like. The positive electrode and the negative electrode of the light-emitting device 2 (refer to reference symbols 27 and 28 shown in FIG. 2) are respectively joined to the frames 51 and 52 with the wires 53 and 54 made of a material such as gold. Then, the surroundings of the light-emitting device 2 are molded with a mold 55 made of a transparent resin.

The lamp of the present invention is not limited to the above structure, and for example a white lamp may also be constituted by a combination of the light-emitting device of the present invention and a cover having a fluorescent substance.

Moreover, the lamp of the present invention may be used for any application, such as a projectile type for general use, a side view type for use in a portable back light, and a top view type for use in an indicator.

Since the light-emitting device of the present invention has excellent current diffusion properties and light extraction efficiency, a lamp having excellent light emission properties can be obtained.

EXAMPLES

Next is a more detailed description of the light-emitting device of the present invention and a lamp using the same, with reference to Examples. It should be noted that the present invention is not to be limited to these Examples.

Experimental Example 1

Figure 5:
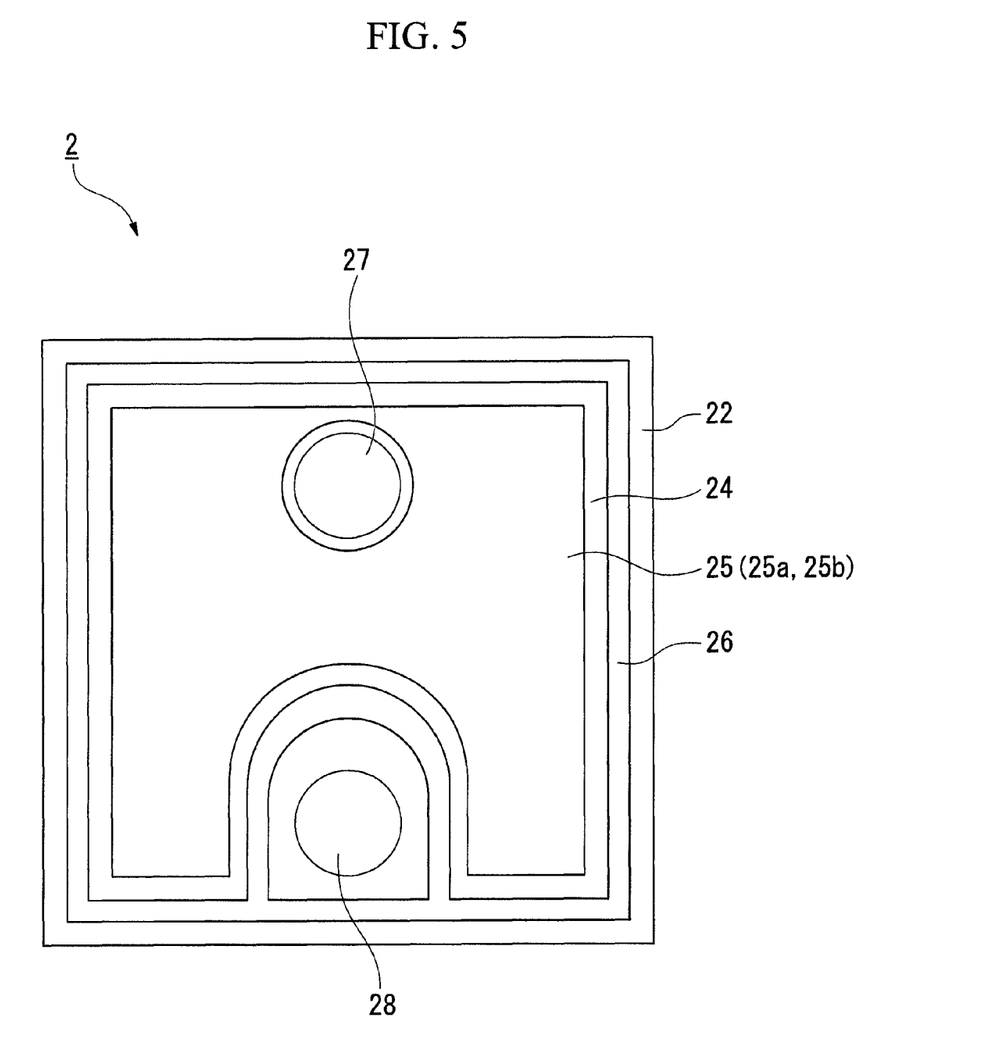
FIG. 5 is a schematic diagram illustrating the light-emitting device of the present invention, showing a planar structure of the light-emitting device shown in FIG. 2.

FIG. 2 shows a cross-sectional schematic diagram of a gallium nitride-based compound semiconductor light-emitting device produced in the present Experimental Example. FIG. 5 shows a plan schematic diagram thereof.
(Production of Gallium Nitride-based Compound Semiconductor Light-emitting Device)

On a substrate 21, which is made of sapphire and to be uses as a substrate for plural light-emitting devices, a gallium nitride-based compound semiconductor layer was laminated via a buffer layer (not shown) made of AlN by the MOCVD method. This gallium nitride-based compound semiconductor layer comprised:

an n-type semiconductor layer 22 in which an under layer of undoped GaN in a thickness of 8 μm, a Ge-doped n-type GaN-contact layer in a thickness of 2 μm, and an n-type $In_{0.1}Ga_{0.9}N$-clad layer in a thickness of 0.02 μm were laminated in this order;

a light-emitting layer 23 of a multiple quantum well structure obtained by five laminations of a Si-doped GaN barrier layer in a thickness of 16 nm and an $In_{0.06}Ga_{0.94}N$ well layer in a thickness of 2.5 nm with a barrier layer on the top; and a p-type semiconductor layer 24 in which a Mg-doped p-type $Al_{0.07}Ga_{0.93}N$-clad layer in a thickness of 0.01 μm and a Mg-doped p-type $Al_{0.02}Ga_{0.98}N$-contact layer in a thickness of 0.18 μm were laminated in this order.

These respective layers were laminated in this order to form the gallium nitride-based compound semiconductor layer as shown in FIG. 2. The light extraction surface was set on the semiconductor side.

In the gallium nitride-based compound semiconductor obtained by the process as mentioned above, the carrier density of the n-type GaN-contact layer was $1 \times 10^{19}$ cm$^{-3}$, the Si dope amount of the GaN barrier layer was $1 \times 10^{17}$ cm$^{-3}$, the carrier density of the p-type AlGaN-contact layer was $5 \times 10^{18}$ cm$^{-3}$, and the Mg dope amount of the p-type AlGaN-clad layer was $5 \times 10^{19}$ cm$^{-3}$.

Moreover, the lamination of the gallium nitride-based compound semiconductor layer was performed by the MOCVD method, under usual conditions well known to those skilled in the art.

Then, this gallium nitride-based compound semiconductor layer was subjected to a reactive ion etching method to expose the n-type GaN-contact layer of an area for forming the negative electrode 28. In this case, first, a resist was evenly applied onto the whole surface of the p-type semiconductor layer 24, and then the resist was removed from the area for forming the negative electrode using a known lithography technique. Then, the resultant product was set in a vacuum evaporator to laminate Ni in a thickness of about 50 nm and Ti in a thickness of 300 nm by an electron beam method under a pressure of $4 \times 10^{-4}$ Pa or less. Then, the metal films together with the resist in areas other than the area for forming the negative electrode were removed by lift-off technique.

Next, the semiconductor laminate substrate was mounted on an electrode in the etching chamber of a reactive ion etching apparatus. The pressure in the etching chamber was reduced to $10^{-4}$ Pa, and then $Cl_2$ as an etching gas was supplied to etch until the n-type GaN-contact layer was exposed. After etching, the resultant product was taken out from the reactive ion etching apparatus, followed by removal of the etching mask with nitric acid and hydrofluoric acid.
(Formation of Titanium Oxide-based Conductive Film)

Next, using a known photolithography technique and lift-off technique, a current diffusion layer was formed only in an area for forming the positive electrode of the surface of the p-type AlGaN-contact layer using a titanium oxide-based conductive film made of $Ti_{0.95}Nb_{0.05}O_2$ under the conditions (film thickness, forming film method, heat treatment condition) shown in Table 1 below. In Experimental Example 1, a current diffusion layer in a thickness of 200 nm was formed by a sputtering method, and a heat treatment was not performed.

Then, the crystalline state of the current diffusion layer obtained as mentioned above was investigated, and the results are shown in Table 1 below.

Next, a light extraction layer was formed on the above-mentioned current diffusion layer using a titanium oxide-based conductive film made of $Ti_{0.95}Nb_{0.05}O_2$ under the conditions (film thickness, forming film method, heat treatment condition) shown in Table 1 below. In Experimental Example 1, a light extraction layer in a thickness of 500 nm was formed by a vacuum vapor deposition method, and the heat treatment was not performed.

Then, the crystalline state of the light extraction layer formed was investigated, and the results are shown in Table 1 below.
(Formation of Concavo-convex Shape)

Next, using a known wet etching technique, a concavo-convex shape was formed on the surface of the light extraction layer.

In this case, the concavo-convex shape was formed by etching the surface of the light extraction film for 5 minutes at the room temperature (25° C.) using a mixture mixed hydrofluoric acid (concentration of 50%) and nitric acid (concentration of 70%) in the ratio of 1:8. The film thickness (film thickness after performing etching) and the elevation difference between the concave part and convex part are shown in Table 1 below. In the concavo-convex shape formed herein, the average diameter of the convex part was 0.3 μm, the average height of the convex part was 0.3 μm, the average distance between the concave part and convex part was 0.8 μm, and the concavo-convex shape was in disorder (randomly patterned).

In addition, in the experimental examples, the elevation difference between concave part and convex part formed on the surface of the light extraction layer was measured using AFM (Atomic Force Microscope, Manufactured by Degital Instrument Inc. USA). The measurement conditions are shown below.
(a) Scan width: 10 μm
(b) Scan rate: 1 Hz
(c) Times of measurement: 256
(d) Mode: Tapping mode
(Formation of Bonding Pad)

Next, a positive electrode (bonding pad) 27 and a negative electrode (bonding pad) 28 were formed by the following procedure.

First, treatments were performed according to a known procedure called lift-off normally. Furthermore, a first layer comprising Au, a second layer comprising Ti, a third layer comprising Al, a fourth layer comprising Ti, and a fifth layer comprising Au were sequentially laminated on a part of the light extraction layer by a similar lamination method, to form a five-layered positive electrode 18. Here, the thicknesses of respective layers comprising Au/Ti/Al/Ti/Au were respectively set to 50/20/10/100/500 nm.

Next, on the n-type GaN-contact layer which had been exposed though the abovementioned reactive ion etching method, the negative electrode was formed by the following procedure.

First, a resist was evenly applied onto the whole surface of the exposed area of the n-type GaN-contact layer, and then the resist was removed from the portion for forming the negative electrode on the exposed n-type GaN-contact layer using a known lithography technique. Then, the negative electrode comprising Ti in a thickness of 100 nm and Au in a thickness of 200 nm sequentially from the semiconductor side, was formed by a normally used vacuum vapor deposition method. The resist was then removed by a known method.

(Formation of Photocatalytic Reaction-prevention Layer)

Next, using a known photolithography technique and lift-off technique, a photocatalytic reaction-prevention layer made of $Al_2O_3$ was formed by the CVD method in a thickness of 500 nm on areas other than the central parts of the positive electrode and the negative electrode. The photocatalytic reaction-prevention layer was formed so as to cover the lateral faces of the positive electrode, the lateral faces of the negative electrode, the light-emitting layer, and the lateral faces of the n-type semiconductor as shown in FIG. 2.

(Division of Device)

The wafer formed up to the photocatalytic reaction-prevention layer in this manner was ground and polished on the back face of the substrate 21 to thereby thin the thickness of the substrate 21 to 80 μm. Ruled lines were drawn using a laser scriber from the semiconductor laminate side, and the layer was pressingly broken to cut it into 350 μm-square chips (light-emitting device).

(Evaluation of Device Characteristics)

An electric current was applied to the chips obtained as mentioned above using a probe needle. The forward voltage at the applied current of 20 mA was measured and the drive voltage (Vf) was investigated. The results are shown in Table 1 below.

Further, the obtained chips were mounted in a TO-18 can package and the light emission output at the applied current of 20 mA was measured using a tester. The results are shown Table 1 below.

Further, the light emission distributions on the light emission surfaces of the chips obtained were investigated. As a result, light emissions were confirmed on the entire surface on the positive electrode.

Further, the gallium nitride-based compound semiconductor light-emitting device lamps of Experimental Examples 2 to 17 were produced in the same manner as that of Experimental Example 1, and were subjected to the same evaluations, except that the current diffusion layer and the light extraction film were formed under the conditions shown in Table 1 below.

A list of the conditions for the formation, and characteristics of the devices of the respective Experimental Examples is shown in Table 1.

TABLE 1

| | Current diffusion layer | | | | Light extraction layer | | | | | | | |
|---|---|---|---|---|---|---|---|---|---|---|---|---|
| | Film thickness | Film forming method | Heat treatment | Crystal state | Film thickness after forming film | Film thickness after performing Etching | Film forming method | Heat treatment | Elevation difference | Crystal state | Light emission output | Drive voltage (Vf) |
| Ex. 1 | 200 nm | Sputtering | N/A | Columnar shape | 500 nm | 300 nm | Vapor deposition | N/A | 270 nm | Granular shape | 13.9 mW | 3.2 V |
| Ex. 2 | 50 nm | Sputtering | N/A | Columnar shape | 500 nm | 300 nm | Vapor deposition | N/A | 290 nm | Granular shape | 13.8 mW | 3.6 V |
| Ex. 3 | 100 nm | Sputtering | N/A | Columnar shape | 500 nm | 300 nm | Vapor deposition | N/A | 300 nm | Granular shape | 13.2 mW | 3.5 V |
| Ex. 4 | 500 nm | Sputtering | N/A | Columnar shape | 500 nm | 300 nm | Vapor deposition | N/A | 270 nm | Granular shape | 13.0 mW | 3.2 V |
| Ex. 5 | 1000 nm | Sputtering | N/A | Columnar shape | 500 nm | 300 nm | Vapor deposition | N/A | 290 nm | Granular shape | 12.7 mW | 3.3 V |
| Ex. 6 | 200 nm | Sputtering | N/A | Columnar shape | 150 nm | 50 nm | Vapor deposition | N/A | 110 nm | Granular shape | 12.4 mW | 3.3 V |
| Ex. 7 | 200 nm | Sputtering | N/A | Columnar shape | 300 nm | 150 nm | Vapor deposition | N/A | 200 nm | Granular shape | 12.8 mW | 3.3 V |
| Ex. 8 | 200 nm | Sputtering | N/A | Columnar shape | 700 nm | 500 nm | Vapor deposition | N/A | 270 nm | Granular shape | 13.6 mW | 3.4 V |
| Ex. 9 | 200 nm | Sputtering | N/A | Columnar shape | 1500 nm | 1000 nm | Vapor deposition | N/A | 660 nm | Granular shape | 13.4 mW | 3.3 V |
| Ex. 10 | 200 nm | Vapor deposition | 50° C., 10 min | Granular shape | 500 nm | 300 nm | Vapor deposition | N/A | 320 nm | Granular shape | 13.7 mW | 3.3 V |
| Ex. 11 | 200 nm | Sputtering | N/A | Columnar shape | 500 nm | 480 nm | Sputtering | N/A | 30 nm | Columnar shape | 10.9 mW | 3.4 V |
| Ex. 12 | 200 nm | Vapor deposition | N/A | Granular shape | 500 nm | 300 nm | Vapor deposition | N/A | 670 nm | Granular shape | 8.7 mW | 4.3 V |
| Ex. 13 | 30 nm | Sputtering | N/A | Columnar shape | 500 nm | 300 nm | Vapor deposition | N/A | 430 nm | Granular shape | 13.8 mW | 4.0 V |
| Ex. 14 | 2500 nm | Sputtering | N/A | Columnar shape | 500 nm | 300 nm | Vapor deposition | N/A | 330 nm | Granular shape | 10.7 mW | 3.4 V |
| Ex. 15 | 200 nm | Sputtering | N/A | Columnar shape | 30 nm | 10 nm | Vapor deposition | N/A | 30 nm | Granular shape | 11.2 mW | 3.5 |
| Ex. 16 | 200 nm | Sputtering | N/A | Columnar shape | 2500 nm | 2400 nm | Vapor deposition | N/A | 180 nm | Granular shape | 10.8 mW | 3.4 V |
| Ex. 17 | 200 nm | Sputtering | N/A | Columnar shape | 4000 nm | 2000 nm | Vapor deposition | N/A | 2200 nm | Granular shape | 9.6 mW | 3.6 V |

(Evaluation Results)

As shown in Table 1, in the light-emitting devices of Experimental Examples 1 to 9 in which the current diffusion layers were formed by a sputtering method while the light extraction layers were formed by a vacuum vapor deposition method, the light emission outputs at the applied current of 20 mA were as high as 12.4 mW or more in all the samples. Further, in the light-emitting devices of Experimental Examples 1 to 9, the drive voltages (Vf) were 3.6 V or less in all the samples, which is sufficiently low.

Accordingly, it was confirmed that in the light-emitting devices of Experimental Examples 1 to 9 in which the current diffusion layers were formed by a sputtering method while the light extraction layers were formed by a vacuum vapor deposition method, the current diffusion layers are hardly damaged even in the case where the concavo-convex shape is formed on the surfaces of the light extraction layers by a wet etching method.

In contrast, in the light-emitting device of Experimental Example 11 in which the current diffusion layer and the light extraction layer were both formed by a sputtering method, although the wet etching was performed on the surface of the light extraction layer under the conditions as mentioned above, the elevation difference of the concavo-convex shape was 30 nm, namely, the surface of the light extraction layer was hardly etched.

As a result, although the drive voltage (Vf) was controlled to as low as 3.4 V, the light emission output was as low as 10.9 mW. Therefore, it is revealed that the current diffusion action of the current diffusion layer functions while the light extraction action of the light extraction layer does not sufficiently function.

Further, in the light-emitting device of Experimental Example of 12 in which the current diffusion layer and the light extraction layer were both formed by a vacuum vapor deposition method, because many current diffusion layers were removed by wet etching, the drive voltage (Vf) was as high as 4.3 V, and the light emission output was as low as 8.7 mW. Thus, good results were not obtained.

Accordingly, it is revealed that in the light-emitting device of Experimental Example 12, both the current diffusion layer and the light extraction layer do not function sufficiently.

Further, in the light-emitting device of Experimental Example 17 in which the elevation difference between the concave part and the convex part formed on the light extraction layer is 2200 nm which exceeds the range regulated in the present invention, the light emission output was as low as 9.6 mW. As a result, excellent device characteristics were not obtained.

Further, in the light-emitting device of Experimental Example 10 in which a heat treatment is performed at a temperature of 500° C. for 10 minutes after forming the current diffusion layer by a vapor deposition method, the drive voltage (Vf) was 3.3 V, and the light emission output was 13.7 mW. As a result, a high output was obtained as well as the light-emitting devices of Experimental Examples 1 to 9 in which the current diffusion layers were formed by a sputtering method.

Further, in the light-emitting devices of Experimental Examples 1 to 10 in which the thicknesses of the current diffusion layers are within the range of 50 nm to 1000 nm, the drive voltages (Vf) of all samples were 3.6 V or less, which were lower than the drive voltage 4.0 V of the light-emitting device of Experimental Example 13 in which the current diffusion layer is formed with the thickness as thin as 30 nm.

Furthermore, in the light-emitting devices of Experimental Examples 1 to 10 which the thicknesses of the current diffusion layers are within the range mentioned above, the light emission outputs of all the samples were 12.4 mW or more, which were higher than the light emission output 10.7 mV of the light-emitting device of Experimental Example 14 in which the current diffusion layer is formed with the thickness as thick as 2500 nm.

Further, in the light-emitting devices of Experimental Examples 1 to 10 in which the thicknesses of the light extraction films after performing etching are within the range of 50 nm to 1000 nm, the light emission outputs of all the samples were 12.4 mW or more as mentioned above, which were higher than the light emission output 11.2 mW of the light-emitting device of Experimental Example 15 in which the light extraction layer is formed with the thickness after performing etching as thin as 10 nm.

Furthermore, in the light-emitting devices of Experimental Examples 1 to 10 in which the thicknesses of the light extraction film after performing etching are within the range as mentioned above, the light emission outputs were higher than the light emission output 10.8 mW of Experimental Example 16 in which the light extraction layer is formed with the thickness after performing etching as thick as 2400 nm due to the high transmittance of the light extraction layer.

From the above results, it is apparent that the light-emitting device of the present invention has excellent current diffusion properties, light extraction efficiency and high device characteristics.

What is claimed is:

1. A light-emitting device, comprising an n-type semiconductor layer, a light-emitting layer, a p-type semiconductor layer and a titanium oxide-based conductive film layer laminated in this order, wherein
the titanium oxide-based conductive film layer comprises a first layer made of a granular crystal and a second layer made of a columnar crystal, the second layer being arranged on the p-type semiconductor layer side of the first layer.

2. The light-emitting device according to claim 1, wherein the surface of the first layer opposite to the second layer side is in a concavo-convex shape.

3. The light-emitting device according to claim 2, wherein the concavo-convex shape formed on the first layer is formed by etching, and the first layer is made of a material in which the etching rate is higher than an etching rate of a material used for the second layer.

4. The light-emitting device according to claim 2, wherein the concavo-convex shape formed on the first layer includes randomly formed concave part and convex part.

5. The light-emitting device according to claim 4, wherein the elevation difference between the concave part and the convex part is within the range from 35 nm to 2000 nm.

6. The light-emitting device according to claim 1, wherein the second layer of the titanium oxide-base conductive film layer is of an oxide comprising Ti and at least one element selected from the group consisting of Ta, Nb, V, Mo, W and Sb.

7. The light-emitting device according to claim 1, wherein the thickness of the second layer of the titanium oxide-base conductive film layer is within the range from 35 to 2000 nm.

8. The light-emitting device according to claim 1, wherein the first layer of the titanium oxide-based conductive film layer is of an oxide comprising Ti and at least one element selected from the group consisting of Ta, Nb, V, Mo, W and Sb.

9. The light-emitting device according to claim 1, wherein the thickness of the first layer of the titanium oxide-base conductive film layer is within the range from 35 to 2000 nm.

10. The light-emitting device according to claim 1, wherein the light-emitting device is made of a nitride-based semiconductor light-emitting device.

11. The light-emitting device according to claim 10, wherein the nitride-based semiconductor light-emitting device is a GaN-based semiconductor light-emitting device.

12. A lamp comprising the light-emitting device according to claim 1.

13. The light-emitting device according to claim 1, wherein a positive electrode is formed on the first layer.

14. The light-emitting device according to claim 1, wherein a metal layer is provided between the second layer and the p-type semiconductor layer, the metal layer being made of a material selected from the group consisting of Ni, Ni oxide, Pt, Pd, Ru, Rh, Re, or Os.

15. The light-emitting device according to claim 1, wherein a metal layer is provided between the first layer and the second layer, the metal layer being made of a material selected from the group consisting of Ni, Ni oxide, Pt, Pd, Ru, Rh, Re, or Os.

16. A method of manufacturing a light-emitting device, comprising
    forming a first layer by a vacuum vapor deposition method, and
    forming a second layer, wherein
    the light-emitting layer includes an n-type semiconductor layer, a light-emitting layer, a p-type semiconductor layer and a titanium oxide-based conductive film layer laminated in this order, and
    the titanium oxide-base conductive film layer comprises the first layer made of a granular crystal and the second layer made of a columnar crystal, the second layer being arranged on the p-type semiconductor layer side of the first layer.

17. The method of manufacturing a light-emitting device according to claim 16, wherein
    the second layer is formed by a sputtering method.

18. The method of manufacturing a light-emitting device according to claim 16, wherein
    the second layer is formed at an atmospheric temperature of 300 to 800° C. by a vacuum vapor method.

19. The method of manufacturing a light-emitting device according to claim 18, wherein
    a heat treatment is performed at a temperature of 300 to 800° C. after forming the second layer by a vacuum vapor method.

20. The method of manufacturing a light-emitting device according to claim 16, further comprising a concavo-convex forming step of forming a concavo-convex shape on the surface of the first layer opposite to the second layer side.

21. The method of manufacturing a light-emitting device according to claim 20, wherein
    in the concavo-convex forming step, the concavo-convex shape is formed by a wet etching method.

22. The method of manufacturing a light-emitting device according to claim 21, wherein
    in the concavo-convex forming step, wet etching is performed using at least one selected from the group consisting of hydrofluoric acid, phosphoric acid, sulfuric acid, hydrochloric acid, hydrofluoric acid/nitric acid mixture, hydrofluoric acid/hydrogen peroxide mixture, hydrofluoric acid/ammonium fluoride mixture and hydrofluosilicid acid as an etching solution.

23. A lamp comprising a light-emitting device obtained by the method of manufacturing a light-emitting device according to claim 16.

* * * * *